United States Patent [19]
Crabtree

[11] Patent Number: 5,461,342
[45] Date of Patent: Oct. 24, 1995

[54] WIDE BANDWIDTH, PHASE-STABLE AMPLIFIER CIRCUIT AND METHOD

[75] Inventor: Willie A. Crabtree, Dallas, Tex.

[73] Assignee: Texas Instruments Incorporated, Dallas, Tex.

[21] Appl. No.: 274,610

[22] Filed: Jul. 13, 1994

[51] Int. Cl.$^6$ ............................................... H03F 3/45
[52] U.S. Cl. ................................. 330/252; 330/69
[58] Field of Search ..................... 330/69, 252, 261, 330/295, 310; 327/563

[56] References Cited

U.S. PATENT DOCUMENTS 4,491,801  1/1985  Kasagi ............................. 330/69

FOREIGN PATENT DOCUMENTS 0236709  9/1989  Japan ............................. 330/252

Primary Examiner—Steven Mottola
Attorney, Agent, or Firm—Robby T. Holland; Wade James Brady, II; Richard L. Donaldson

[57] ABSTRACT

A wide bandwidth, phase-stable amplifier circuit (10) and method is provided. Amplifier circuit (10) comprises amplifier cells (12a) and (12b) and a low impedance summing circuit (14). Each of amplifier cells (12a) and (12b) are biased at a predetermined bias current lower than a typical amplifier cell. The output of amplifier cells (12a) and (12b) are coupled to amplifier circuit (14) having transistors (30) and (32) coupled in a cascode configuration. By using the low bias current in amplifier cells (12a) and (12b) and the low impedance summing circuit (14), amplifier circuit (10) provides a wide bandwidth, phase-stable amplifier circuit.

13 Claims, 3 Drawing Sheets

WIDE BANDWIDTH, PHASE-STABLE AMPLIFIER CIRCUIT AND METHOD

TECHNICAL FIELD OF THE INVENTION

This invention relates in general to the field of amplifier circuits. More particularly, this invention relates to a wide bandwidth, phase-stable amplifier circuit and method.

BACKGROUND OF THE INVENTION

Amplifier circuits are widely used in electronic systems to allow processing of weak signals. Typically, an amplifier circuit will produce substantially constant gain only over a specific frequency range referred to as the bandwidth of the amplifier. In some applications the operability of an amplifier circuit is limited by this bandwidth. Consequently, much design effort is focused on increasing the bandwidth of amplifier circuits. Amplifier circuits are also limited by their phase-stability. The amplifier may introduce a phase difference between the input signal and the output signal. Each of these limitations may reduce the usefulness of an amplifier.

An exemplary system that requires a high bandwidth phase-stable amplifier is a phase-only direction finding circuit. Such circuits may be used, for example, in various military applications such as, ARM seekers, radar warning and homing receivers, ELS receivers, as well as radar, and the like. Typically, such electronic circuits incorporate an IF amplifier. To produce useful information, the IF amplifier should provide low amplitude modulation-to-phase modulation (phase stability), as well as channel-to-channel gain/phase tracking over a wide bandwidth.

Heretofore known phase-only direction finding systems typically use limiter circuits, successive detection log amplifier circuits, and true log amplifier circuits. Each of these circuits includes some form of an amplifier circuit. Successive detection log amplifiers typically comprise a limiter in each stage to limit the inputs to succeeding stages. This reduces "overdrive" and helps speed up the overload recovery time. True log amplifiers also use a limiter. In a true log amplifier, a limiter is typically placed in parallel with a unity gain stage. The limiter is typically used for small signal amplification and the unity gain stage typically is used to handle signals up to the largest expected signal without limiting.

Use of a limiter in each of these circuits creates a common problem known as phase runout or phase instability. Substantial phase runout may create false readings in a phase-only direction finding system. In true log IF amplifiers, phase runout may be caused by the size of the IF input signal. For example, the phase of the output IF signal may change as the input signal gets larger and larger because the small signal insertion phase of the limiter portion is not the same as the insertion phase of the unity gain portion. At small signals, the phase of the output is that of the limiter portion. At large signals, the phase of the output is that of the unity gain portion. Another contributor to the phase runout is that the insertion phase changes in the limiter portion as the limiter is driven into harder and harder limiting. This may cause a shift of more than several degrees in the amplifier. In successive detection log amplifiers, the limiters may also cause a phase runout problem if the phase is used for monopulse direction finding. Successive detection log amplifiers have had a problem with not phase tracking for unequal inputs since one channel may have one or more additional stages in limiting relative to the other channel.

Another problem with heretofore known phase-only direction finding systems is that the bandwidth of the system may not be adequate to detect the possible frequency range of incoming signals. The bandwidth of the system is typically limited by the bandwidth of the amplifier circuit.

SUMMARY OF THE INVENTION

Therefore, a need has arisen for a phase-stable amplifier. A further need exists for an amplifier having an increased bandwidth.

In accordance with the present invention, a wide bandwidth, phase stable amplifier circuit and method is provided that substantially eliminates or reduces disadvantages and problems associated with previously developed circuits and methods.

In one embodiment, the present invention provides an amplifier circuit. The amplifier circuit comprises a plurality of amplifier cells. Each amplifier cell has an input, an output and a predetermined gain. The input of each amplifier cell is coupled together to receive a single input signal. Each amplifier cell also comprises a current source for providing a predetermined bias current. Finally, the amplifier circuit comprises a summing circuit coupled to the output of each amplifier cell. The summing circuit sums the output of each amplifier cell such that the amplifier produces a phase-stable, wide bandwidth output. The summing circuits are coupled to the amplifier cells through a predetermined low impedance path so as to substantially isolate the output of each amplifier cell for summing.

A technical advantage of the present invention is that it both increases the phase stability and increases the bandwidth associated with heretofore known amplifiers without sacrificing gain. In one embodiment, the amplifier of the present invention is biased at a current that is lower than the bias current of a typical amplifier thereby reducing the base-emitter capacitance of the transistor in the amplifier. This lowers the time-constant associated with the transistor and therefore increases the bandwidth of the amplifier. Furthermore, the base-emitter capacitance may be charged and discharged more quickly, thus resulting in a quicker response with less phase shift. Although the lower bias current reduces the gain of an amplifier cell, in one embodiment, the amplifier of the present invention uses a plurality of amplifier cells and sums their outputs in a low impedance circuit to restore the gain.

Another technical advantage of the present invention is that it may be manufactured as an integrated circuit thereby reducing the cost of a typical phase-only direction finding circuit. Typically, such a circuit requires matched transistors in amplifier channels which may cost in the thousands of dollars. The high expense of such circuits is due to complex hybrid construction that is used because existing IC designs are either non-compliant or too expensive. A circuit constructed according to the teaching of the present invention reduces the cost associated with such a circuit because it uses existing IC technology to meet the increased electrical performance requirements. No expensive front-end changes are required. Furthermore, no new IC fabrication techniques need to be developed.

Another technical advantage of the present invention is that it may be fabricated with either silicon or gallium arsenide bipolar transistors.

Another technical advantage of the present invention is that the increase in bandwidth and increase in phase stability are achieved without an increase in power consumption because the reduction in bias current offsets any increase in operating voltage.

Another technical advantage of the present invention is that it uses multiple amplifiers coupled to a summing circuit through a low impedance path so as to achieve a desired overall gain while also increasing bandwidth and improving phase stability.

Another technical advantage of the present invention is that it may be constructed with either differential or single-ended amplifiers.

Another technical advantage of the present invention is that it is compatible with operation at IF, RF, UHF and microwave frequencies.

Another technical advantage of the present invention is that it may be used in various applications including, but not limited to, true log amplifier circuits, successive detection log amplifier circuits, and limiter circuits.

BRIEF DESCRIPTION OF THE DRAWINGS

For a more complete understanding of the present invention and advantages thereof, reference is now made to the following description taken in conjunction with the accompanying drawings in which like reference numbers indicate like features and wherein.

DETAILED DESCRIPTION OF THE INVENTION

Figure 1:
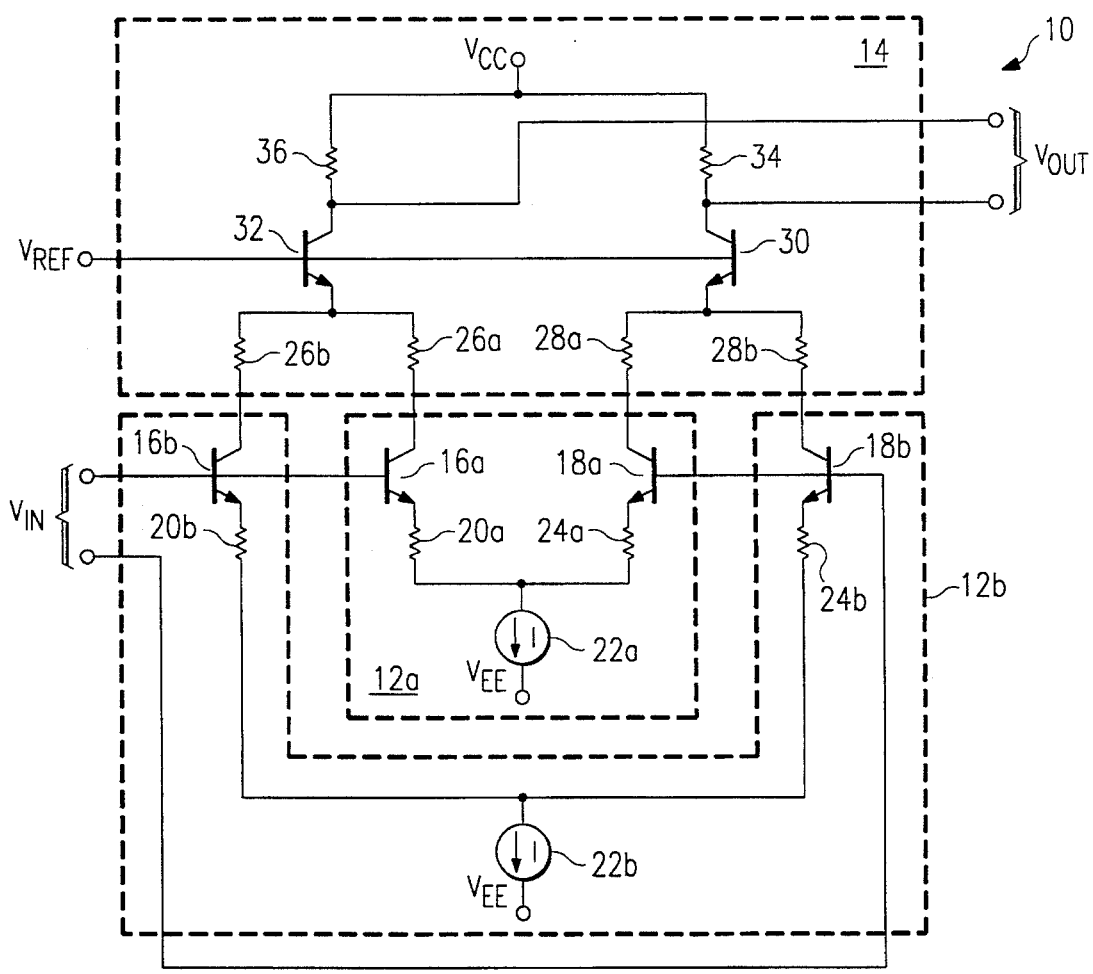
FIG. 1 is a schematic diagram of a high bandwidth, phase-stable amplifier circuit constructed according to the teachings of the present invention.
Figure 2:
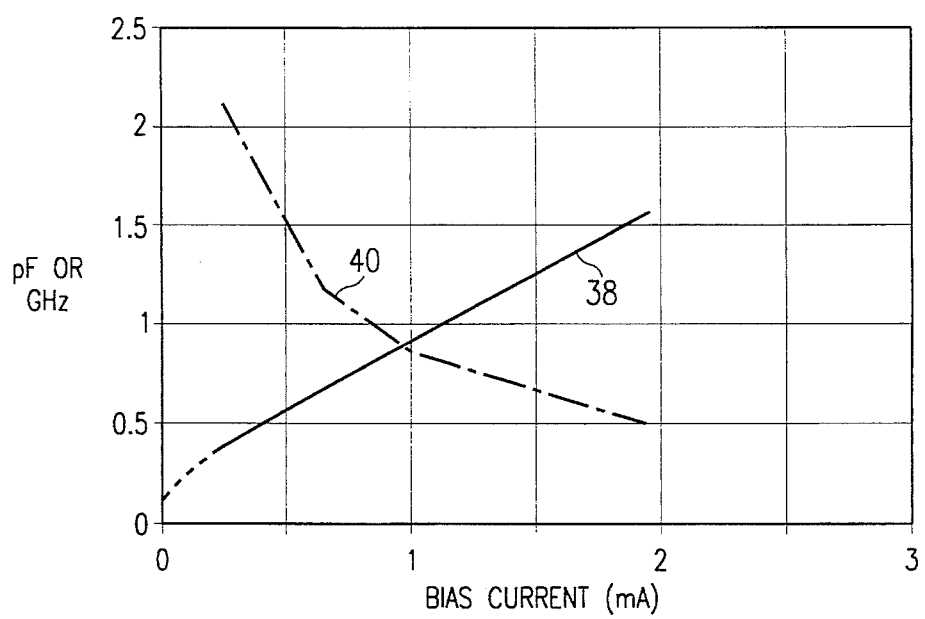
FIG. 2 is a graph illustrating the effect of changes in bias current on both input cutoff corner frequency and base-emitter capacitance of a transistor.

FIG. 1 is a schematic diagram of a high bandwidth, phase-stable amplifier circuit indicated generally at 10 and constructed according to the teachings of the present invention. Amplifier circuit 10 may comprise a general purpose amplifier. By varying the value of various components, circuit 10 may, for example, be used in various stages of a true log amplifier, stages of a successive detection log amplifier, a limiter, or any other appropriate circuit requiring a high bandwidth, phase-stable amplifier. Amplifier circuit 10 achieves a wide bandwidth with respect to traditional amplifier circuits by operating at a lower bias current. This reduces the base-emitter capacitance and allows the amplifier to process signals at higher frequencies. FIG. 2 is a graph illustrating the relationship between bias current and both base-emitter capacitance and the input corner frequency. Capacitance curve 38 shows that the base-emitter capacitance increases as the bias current increases. Similarly, corner frequency curve 40 shows that the corner frequency which defines the upper limit of the bandwidth of an amplifier, increases as the bias current decreases. Unfortunately, operating an amplifier at a lower bias current typically reduces the gain of the amplifier. Circuit 10 offsets the reduced gain by using a plurality of amplifier cells 12 coupled to a low impedance summing circuit 14 which sums the gains of each amplifier cell 12.

Figure 3:
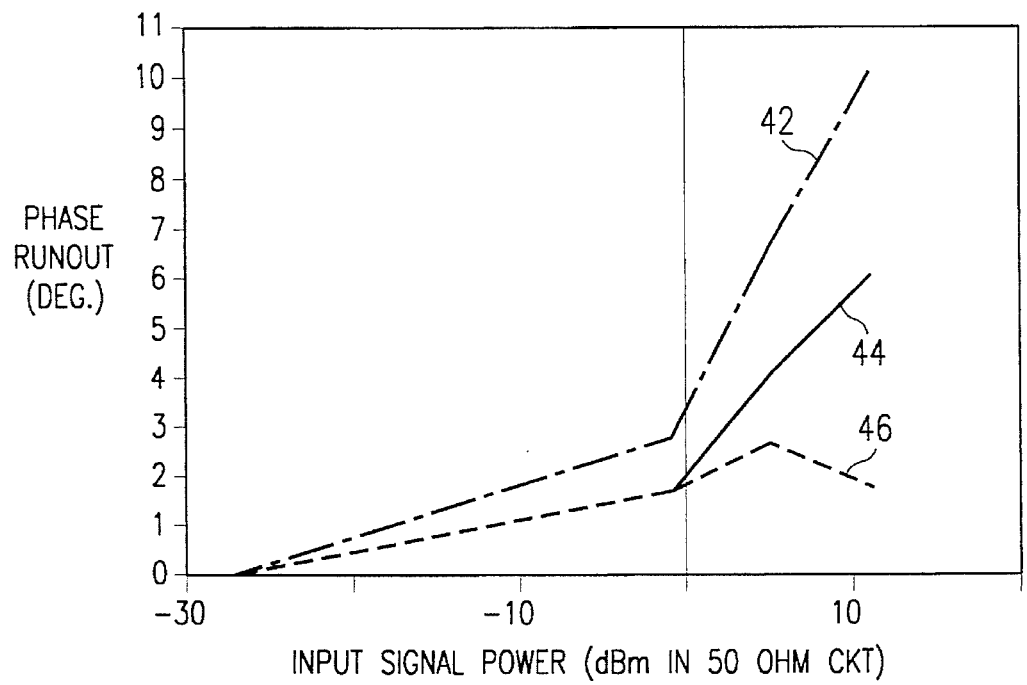
FIG. 3 is a graph illustrating the effect of changes in bias current and gain on the phase stability of the circuit of FIG. 1.

The phase stability of circuit 10 is also improved by operating at low bias current. FIG. 3 is a graph illustrating the effect of changes in bias current and gain on the phase stability of circuit 10 of FIG. 1. In FIG. 3, the phase runout of the circuit is plotted along the vertical axis in degrees. Additionally, the input signal power in decibels is plotted along the horizontal axis. The data in FIG. 3 is derived using a differential amplifier operated at 600 megahertz. Curve 42 illustrates phase runout for a circuit having a bias current of 2 milliamps and a gain of 2. Curve 44 illustrates the phase runout for a circuit having a current of 1 milliamp and a gain of 1. Finally, curve 46 illustrates the phase runout for a circuit with a bias current of ½ milliamp and a gain of ½. FIG. 3 shows that the phase runout decreases at lower bias current.

Amplifier circuit 10 comprises amplifier cells 12a and 12b, and a summing circuit 14. Amplifier cells 12a and 12b may comprise, for example, transistors coupled in differential pairs. As shown, amplifier cells 12a and 12b each comprise first transistors 16a and 16b, respectively. Transistors 16a and 16b may comprise, for example, NPN bipolar junction transistors. A base of transistors 16a and 16b may be coupled together to receive a first input voltage. Amplifier cells 12a and 12b may also comprise second transistors 18a and 18b. Second transistors 18a and 18b may also comprise NPN bipolar junction transistors, each having a base coupled to receive a second input voltage. Amplifier cells 12a and 12b may further comprise first resistors 20a and 20b, respectively. Resistor 20a may be coupled between an emitter of transistor 16a and a current source 22a. Resistor 20b may be coupled between an emitter of transistor of 16b and a current source 22b. Current source 22a and current source 22b may comprise, for example, current mirrors or any other appropriate sources for generating a desired current. Amplifier cells 12a and 12b may further comprise second emitter resistors 24a and 24b. Resistor 24a may be coupled between an emitter of transistor 18a and current source 22a. Resistor 24b may be coupled between an emitter of transistor 18b and current source 22b.

Figure 4:
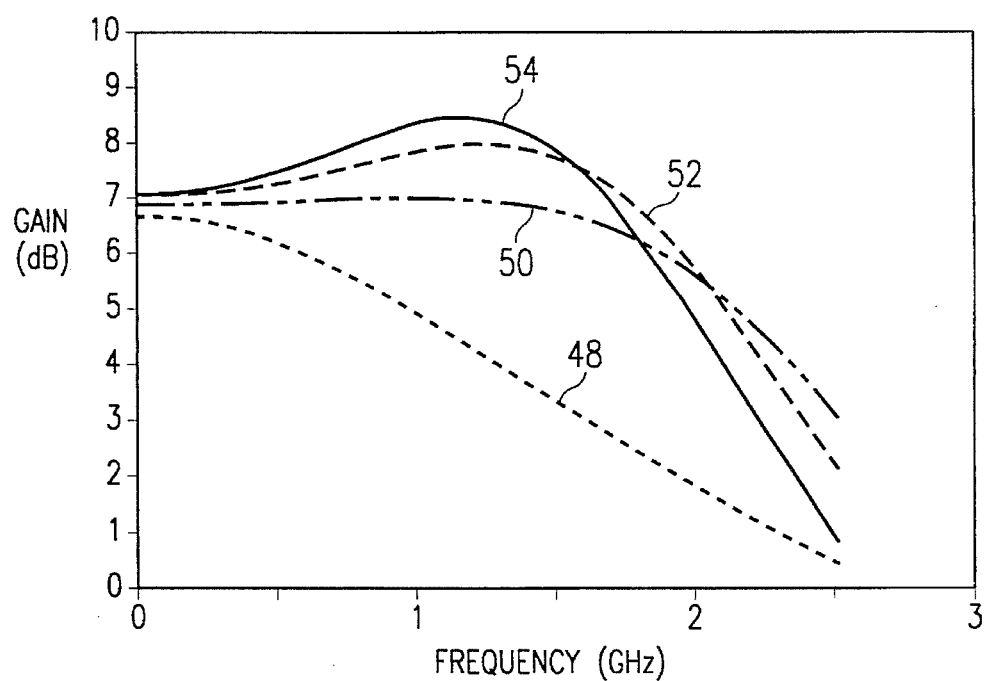
FIG. 4 is a graph illustrating the frequency response for an amplifier circuit of FIG. 1 having various numbers of amplifier cells.

Amplifier circuit 10 is not limited to a particular number of amplifier cells 12. In FIG. 1, two amplifier cells 12 are shown by way of example, and not by way of limitation. Circuit 10 may comprise 2, 3, 4 or any appropriate number of amplifier cells 12 to generate a predetermined gain along with a phase-stable, wide bandwidth. FIG. 4 is a graph illustrating the frequency response for amplifier circuit 10 of FIG. 1 having 2, 3, and 4 amplifier cells 12 versus a conventional differential amplifier. In FIG. 4, curve 48 illustrates the frequency response for conventional differential amplifier circuit having a single amplifier cell 12. Curve 50 illustrates a frequency response for an amplifier circuit 10 having two amplifier cells 12. Curve 52 illustrates a frequency response for an amplifier circuit 10 having three amplifier cells 12. Curve 54 illustrates a frequency response for an amplifier circuit 10 having four amplifier cells 12. As shown in FIG. 4, the frequency response is greatly improved when more than one amplifier cell and the cascode summing circuit is used instead of normal collector resistors.

Summing circuit 14 is coupled to amplifier cells 12a and 12b through a low impedance path so as to achieve an overall desired gain while maintaining the increase in bandwidth produced by amplifier cells 12a and 12b. Summing circuit 14 comprises isolation resistors 26a, 26b, 28a, and 28b in series from the collectors of transistors 16a, 16b, 18a, and 18b, respectively. Isolation resistors 26a, 26b, 28a, and 28b function to isolate the collectors of transistors 16a, 16b, 18a, and 18b, and their associated capacitances, from the remainder of summing circuit 14. This configuration also prevents current surges when summing circuit 14 goes from an off to an on state during each half of a cycle of the input signal when the amplifier is in saturation. This has the added benefit of reducing phase runout.

Summing circuit 14 may also comprise, for example, first and second transistors 30 and 32 and first and second resistors 34 and 36. Transistors 30 and 32 are coupled in a cascode configuration wherein the base of each transistor is coupled together. Furthermore, the common base of transistors 30 and 32 are coupled to a predetermined reference voltage. For example, the reference voltage may comprise approximately 5 volts, or other appropriate value.

Isolation resistors 26a, 26b, 28a, and 28b may be coupled between transistors 30 and 32 of summing circuit 14 and transistors 16a, 16b, 18a, and 18b of amplifier cells 12a and 12b. For example, isolation resistor 26a may be coupled between an emitter of transistor 32 and a collector of transistor 16a. Additionally, isolation resistor 26b maybe coupled between an emitter of transistor 32 and a collector of transistor 16b. Isolation resistor 28a may be coupled between an emitter of transistor 30 and a collector of transistor 18a. Finally, isolation resistor 28b may be coupled between an emitter of transistor 30 and a collector of transistor 18b.

Figure 5:
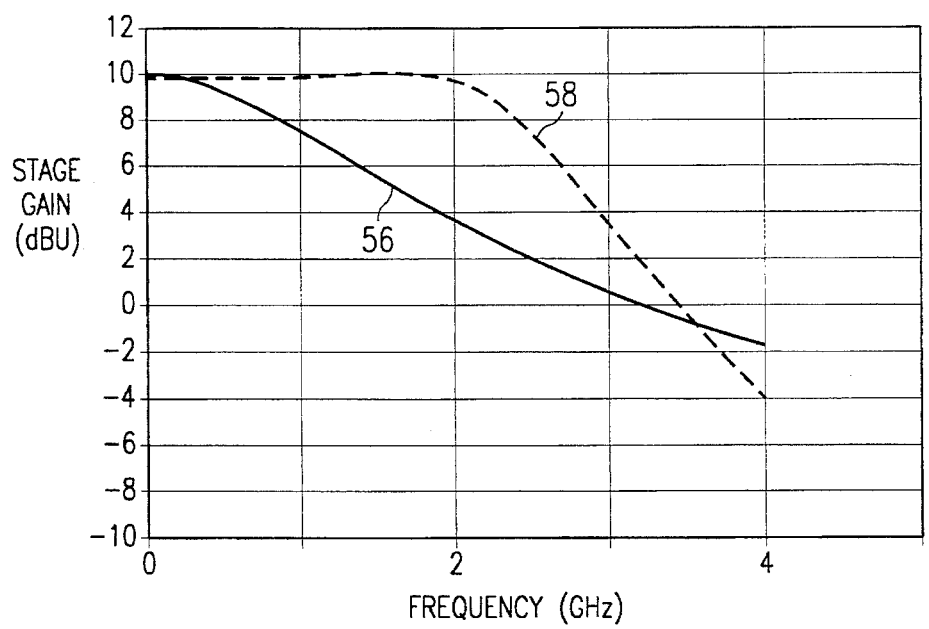
FIG. 5 is a graph illustrating the increased bandwidth of the circuit of FIG. 1 in a true log amplifier configuration with a cascode summing circuit.

First resistor 34 may be coupled between a power supply Vcc and a collector of transistor 30. The value of power supply Vcc may comprise, for example, 10 volts or other appropriate value. At this voltage level, circuit 10 does not increase power consumption over typical amplifier circuits due to the decrease in bias current. Second resistor 36 may be coupled between power supply Vcc and a collector of transistor 32. The output of summing circuit 14 may be taken differentially at the collectors of transistors 30 and 32. The effect of isolation resistors 26a, 26b, 28a and 28b and cascode transistor 30 and 32 on the output of circuit 10 is illustrated in FIG. 5. Curve 56 shows the frequency response of a circuit of FIG. 10 without a cascoded output. Curve 58 shows an increase in bandwidth when summing circuit 14 uses a cascode configuration with isolation resistors.

Amplifier cells 12a and 12b are shown as differential amplifiers. It should be understood that amplifier cells 12a and 12b may be modified to receive a single ended input and produce a single ended output.

Transistors 16a, 16b, 18a, and 18b of amplifier cells 12a and 12b should be smaller than transistors 30 and 32 of summing circuit 14.

In operation, amplifier cells 12a and 12b of circuit 10 are biased at a predetermined bias current by current sources 22a and 22b. An input signal is applied to amplifier cells 12a and 12b at the base of transistors 16a, 16b, 18a, and 18b. Amplifier cells 12a and 12b amplify the input signal and provide outputs to summing circuit 14. Summing circuit 14 effectively adds the output of amplifier cells 12a and 12b to provide an output between the collector of transistor 30 and the collector of transistor 32.

Amplifier circuit 10 may be used to perform various functions. For example, amplifier circuit 10 may be used as a limiter circuit by adjusting the product of the current source and resistors 34 and 36 so as to provide a predetermined limited output. Alternatively, amplifier circuit 10 may function as a general purpose amplifier having a predetermined gain. Circuit 10 may produce a gain that is substantially identical to that of a single differential pair amplifier by adjusting the value of resistors 20a, 20b, 24a, and 24b as well as current sources 22a and 22b. For example, if circuit 10 has two amplifier cells 12, each of the resistors 20a, 20b, 24a, and 24b should be twice the value of corresponding emitter resistors in a standard differential pair amplifier. Furthermore, the current source 22a and 22b should draw half the current of a traditional differential pair amplifier circuit. It is noted that this amplifier circuit would have the same gain as the traditional circuit, but would also have an improved bandwidth and phase-stability.

Amplifier circuit 10 may also be used as a stage in a true log amplifier. For example, resistors 20a and 24a and current source 22a may be chosen to set amplifier cell 12a to be a limiter circuit. Additionally, resistors 20b and 24b and current source 22b may be chosen to set the gain of gain cell 12b to a unity value. In this manner, amplifier circuit 10 may function as one gain stage in a true log amplifier. A plurality of these cells with varying limiting values may be coupled in series to produce a true log amplifier.

Figure 6:
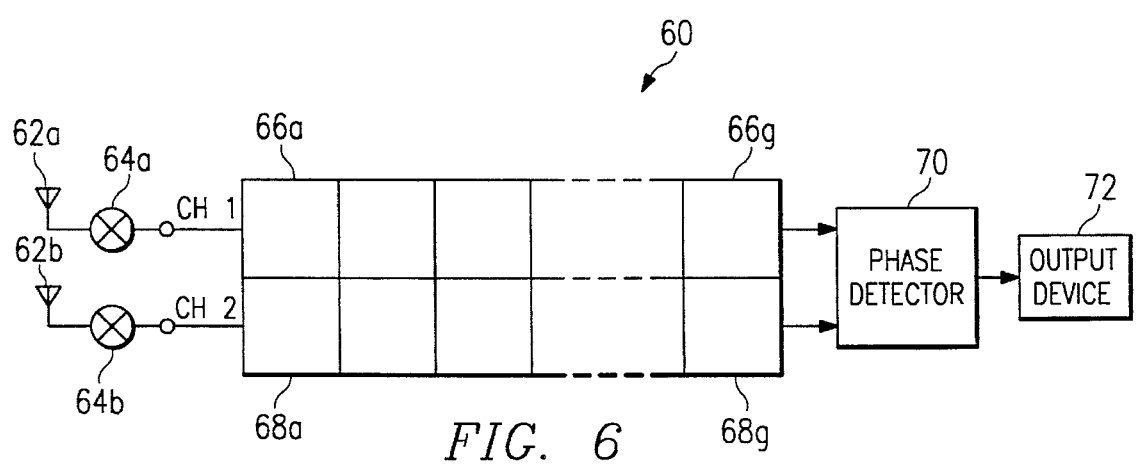
FIG. 6 is a phase-only direction finding system incorporating the circuit of FIG. 1.

FIG. 6 is a phase-only direction finding system 60 incorporating a plurality of amplifier circuits of FIG. 1. Amplifier circuit 10 of FIG. 1 may be used in a phase-only direction finding system due to its phase-stability. Such a system determines the direction of an incoming electromagnetic signal by measuring the signal on separate channels at different locations and determining the phase difference between the channels. Traditional direction finding systems have been very costly to produce because the transistors in the various channels need to substantially match. In hybrid construction, this is expensive. A circuit may be constructed according to the teachings of the present invention as a single integrated circuit, thereby reducing problems with matching transistors.

Direction finding system 60 may comprise, for example, first and second channel having antennas 62a and 62b, respectively. Antennas 62a and 62b are coupled to mixers 64a and 64b, respectively. Mixer 64a is coupled to a plurality of amplifier circuits 66a through 66g. Each of amplifier circuits 66a through 66g may comprise an amplifier circuit of the type shown in FIG. 1. Amplifier circuit 66a through 66g are coupled in series. Additionally, channel 2 may comprise a plurality of amplifier circuits 68a through 68g coupled in series. Amplifier circuit 68a is coupled to mixer 64b. Each of amplifier circuits 66a through 66g and 68a through 68g may comprise a true log version of amplifier circuits 10 of FIG. 1 as described above. A phase detector 70 is coupled to an output of each of amplifier circuits 66g and 68g. An output device 72 is coupled to phase detector 70. It is noted that amplifier circuits 66a through 66g and 68a through 68g may be fabricated as a single integrated circuit.

In operation, an electromagnetic signal is transmitted at direction finding system 60. The electromagnetic signal is received at antenna 62a and 62b. The received electromagnetic signal is passed through mixers 64a and 64b to amplifier circuits 66a through 66g and 68a through 68g, respectively. Any phase difference between the signal received by antenna 62a and the signal received by antenna 62b is detected by phase detector 70. Based on the detected phase difference, output device 72 displays the direction of the incoming electromagnetic signal.

Although the present invention has been described in detail, it should be understood that various changes, substitutions and alterations can be made hereto without departing from the spirit and scope of the invention as defined by the appended claims. For example, the number of amplifier cells 12 incorporated in circuit 10 may be varied. Additionally, the value of the various resistors of circuit 10 may be chosen to achieve a predetermined gain. Furthermore, circuit 10 may be fabricated using either silicon or gallium arsenide technology. Direction finding system 60 may comprise any appropriate number of amplifier circuits 66 and 68.

What is claimed is:

1. An amplifier circuit, comprising:
   a plurality of amplifier cells each having an input, an output and a predetermined gain, the input of each amplifier cell coupled together to receive an input signal;
   a current source coupled to each amplifier cell for providing a predetermined bias current; and
   circuitry coupled to the output of each amplifier cell and operable to sum the output of each amplifier cell such that the amplifier produces a phase-stable, wide bandwidth output, said summing circuitry coupled to said amplifier cells through a predetermined low impedance path so as to substantially isolate the output of each amplifier cell for summing, wherein said summing circuitry comprises:
   first and second bipolar junction transistors coupled in a cascode configuration;
   first and second collector resistors, each coupled to a collector of one of said first and second transistors, said summing circuit comprising a differential output at said collectors of said transistors; and
   a plurality of isolation resistors, each coupled between one of said emitters of said transistors and one of said amplifier cells.

2. An amplifier circuit, comprising:
   a plurality of amplifier cells each having an input, an output and a predetermined gain, the input of each amplifier cell coupled together to receive an input signal;
   a current source coupled to each amplifier cell for providing a predetermined bias current;
   circuitry coupled to the output of each amplifier cell and operable to sum the output of each amplifier cell such that the amplifier produces a phase-stable, wide bandwidth ouput, said summing circuitry coupled to said amplifier cells through a predetermined low impedance path so as to substantially isolate the output of each amplifier cell for summing; and
   a plurality of isolation resistors, each isolation resistor coupled between an amplifier cell and an input of said summing circuitry.

3. An amplifier circuit, comprising;
   a plurality of amplifier cells each having an input, an output and a predetermined gain, the input of each amplifier cell coupled together to receive an input signal;
   a current source coupled to each amplifier cell for providing a predetermined bias current;
   circuitry coupled to the output of each amplifier cell and operable to sum the output of each amplifier cell such that the amplifier produces a phase-stable, wide bandwidth output, said summing circuitry coupled to said amplifier cells through a predetermined low impedance path so as to substantially isolate the output of each amplifier cell for summing; and
   wherein said plurality of amplifier cells comprises:
   a limiter circuit for receiving and amplifying signals having a first predetermined amplitude range; and
   a unity gain amplifier circuit for receiving and amplifying input signals having a second predetermined amplitude range greater than said first predetermined amplitude range.

4. A direction finding system, comprising:
   circuitry for receiving an incoming electromagnetic signal in first and second channels;
   a plurality of amplifier circuits, a portion coupled in series along said first channel and a portion coupled in series along said second channel, said channels of amplifier circuits coupled to said receiving circuitry, each said amplifier circuit comprising:
   a plurality of amplifier cells each having an input, an output and a predetermined gain, the input of each amplifier cell coupled together to receive an input signal from one of said amplifier circuits and said receiving circuitry;
   a current source coupled to each amplifier cell for providing a predetermined bias current; and
   circuitry coupled to the output of each amplifier cell and operable to sum the output of each amplifier cell such that the amplifier produces a phase-stable wide bandwidth output, said summing circuitry coupled to said amplifier cells through a predetermined low impedance path so as to substantially isolate the output of each amplifier cell, wherein the amplifier circuits in series produce an output that is substantially the logarithm of the input from the receiving circuit;
   a phase detector coupled to said plurality of amplifier circuits and operable to determine a phase difference between said first and second channels; and
   an output device for determining the direction of an incoming signal based on the detected phase difference.

5. The system of claim 4, wherein each amplifier cell comprises single-ended input and output amplifiers comprising:
   an NPN bipolar junction transistor; and
   a resistor coupled to an emitter of said transistor.

6. The system of claim 4, wherein each amplifier cell comprises a double-ended input and output amplifier comprising:
   first and second bipolar junction transistors coupled in a differential pair; and
   first and second emitter resistors each having first and second ends, said first ends coupled together and said second ends coupled to an emitter of one of said first and second transistors.

7. The system of claim 4, wherein said circuit is fabricated using gallium arsenide and related circuit technology.

8. The system of claim 4, wherein said summing circuitry comprises:
   first and second bipolar junction transistors coupled in a cascode configuration;
   first and second collector resistors, each coupled to a collector of one of said first and second transistors, said summing circuit comprising a differential output at said collectors of said transistors; and
   a plurality of isolation resistors, each coupled between one of said emitters of said transistors and one of said amplifier cells.

9. The system of claim 4 and further comprising a plurality of isolation resistors, each isolation resistor coupled between an amplifier cell and an input of said summing circuitry.

10. The system of claim 4, wherein said plurality of amplifier cells comprises two amplifier cells.

11. The system of claim 4, wherein said plurality of amplifier cells comprises:

a limiter circuit for receiving and amplifying signals having a first predetermined amplitude range; and a unity gain amplifier circuit for receiving and amplifying input signals having a second predetermined amplitude range greater than said first predetermined amplitude range.

12. A method for amplifying a signal comprising the steps of:

biasing a plurality of amplifier cells at a predetermined, low bias current;

applying an input signal to the plurality of amplifier cells, each amplifier cell having an input, an output and a predetermined gain, the input of each amplifier cell coupled together; and summing the output of each amplifier cell in a summing circuit coupled to the output of each amplifier cell through a predetermined low impedance path so as to substantially isolate the output of each amplifier cell for summing such that the amplifier produces a phase-stable, wide bandwidth output by summing the output of each amplifier cell in a circuit comprising first and second bipolar junction transistors coupled in a cascode configuration, first and second collector resistors, each resistor coupled to a collector of one of the first and second transistors, the summing circuit comprising a differential output at the collectors of the transistors, and a plurality of isolation resistors, each isolation resistor coupled between one of the emitters of the transistors and one of the amplifier cells.

13. A method for amplifying a signal comprising the steps of:

biasing a plurality of amplifier cells at a predetermined, low bias current;

applying an input signal to the plurality of amplifier cells, each amplifier cell having an input, an output and a predetermined gain, the input of each amplifier cell coupled together; and summing the output of each amplifier cell in a summing circuit coupled to the output of each amplifier cell through a predetermined low impedance path so as to substantially isolate the output of each amplifier cell for summing such that the amplifier produces a phase-stable, wide bandwidth output; and isolating the amplifier cells from the summing circuit with a plurality of isolation resistors, each isolation resistor coupled between an amplifier cell and an input of the summing circuit.

* * * * *